(12) United States Patent
Lassiter et al.

(10) Patent No.: US 10,533,104 B2
(45) Date of Patent: Jan. 14, 2020

(54) TWO-STEP PROCESS FOR FORMING CURED POLYMERIC FILMS FOR ELECTRONIC DEVICE ENCAPSULATION

(71) Applicant: Kateeva, Inc., Newark, CA (US)

(72) Inventors: Brian E. Lassiter, Berkeley, CA (US);
Lorenza Moro, Palo Alto, CA (US);
Teresa A. Ramos, San Jose, CA (US);
Elizabeth Tai, Cupertino, CA (US);
Alonso Serrato, Newark, CA (US);
Vera Steinmann, Menlo Park, CA (US)

(73) Assignee: Kateeva, Inc., Newark, CA (US)

(\*) Notice: Subject to any disclaimer, the term of this patent is extended or adjusted under 35 U.S.C. 154(b) by 0 days.

(21) Appl. No.: 16/050,000

(22) Filed: Jul. 31, 2018

(65) Prior Publication Data

US 2019/0136075 A1    May 9, 2019

Related U.S. Application Data

(60) Provisional application No. 62/553,633, filed on Sep. 1, 2017.

(51) Int. Cl.
| | |
|---|---|
| *C09D 11/101* | (2014.01) |
| *C09D 11/107* | (2014.01) |
| *H01L 51/56* | (2006.01) |
| *H01L 51/52* | (2006.01) |

(52) U.S. Cl.
CPC .......... *C09D 11/101* (2013.01); *C09D 11/107* (2013.01); *H01L 51/5256* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2002/0149659 A1 | 10/2002 | Wu et al. | |
| 2007/0019911 A1* | 1/2007 | Wu | G02B 6/1221 385/40 |
| 2011/0132449 A1 | 6/2011 | Ramadas et al. | |
| 2012/0127249 A1 | 5/2012 | Mizutaki et al. | |
| 2018/0138116 A1* | 5/2018 | Lin | H01L 21/4853 |

OTHER PUBLICATIONS

International Search Report and Written Opinion dated Oct. 17, 2018, to PCT Application No. PCT/US2018/44529.
Wikipedia, "Plasma Lamp", May 4, 2016, retrieved by ISA/US on Oct. 1, 2018 from https://en.wikipedia.org/index.php?title=Plasma_lamp&oldid=718631049.

\* cited by examiner

*Primary Examiner* — Thien F Tran
(74) *Attorney, Agent, or Firm* — Paula J. Tostado

(57) ABSTRACT

Methods for increasing the degree of curing and/or reducing the volatile photoinitiator concentration in cured polymeric film, and particularly in cured polymeric films in a multi-layered thin film encapsulation stack are provided. Also provided are highly crosslinked and/or low-outgassing thin polymeric films and encapsulation stacks made using the methods.

15 Claims, 7 Drawing Sheets

TWO-STEP PROCESS FOR FORMING CURED POLYMERIC FILMS FOR ELECTRONIC DEVICE ENCAPSULATION

CROSS-REFERENCE TO RELATED APPLICATION

The present application claims priority to U.S. provisional patent application No. 62/553,633 that was filed on Sep. 1, 2017, the entire contents of which are hereby incorporated herein by reference.

BACKGROUND

Polymer films formed from ultraviolet (UV)-curable ink compositions are used as planarization and decoupling layers in the multilayered thin film encapsulation of organic light-emitting diode (OLED) devices and other electronic devices, in order to prevent exposure of the devices to moisture and oxygen. The multilayer thin films used for the encapsulation of the devices are composed of stacks of alternating layers of the polymeric films and inorganic barrier layers.

A desirable feature of cured polymeric films used in thin film encapsulation is a high degree of cure, which provides the films with an environmental stability due to reduced free volume and, therefore, lower water diffusion and solubility in the film. Unfortunately, conventional ultraviolet curing processes use high-intensity ultraviolet radiation that can lead to fast vitrification, which limits the degree of curing.

Another desirable feature of the polymeric films used in thin film encapsulation is low outgassing. This is because volatile chemical species from the polymeric films that become trapped inside the encapsulation stacks can negatively impact the performance of the encapsulated device. By diffusing in the polymeric film and through pinholes of the inorganic barrier layer adjacent to a device, volatile species may react with active functional layers in the device, deteriorating its performance characteristics. In addition, mobile volatile species may accumulate at point defects in the device structure, producing bubbles. These bubbles may lead to delamination of layers inside the device itself (e.g., cathode delamination), producing black spots, or inside the multilayered encapsulation stack (e.g., between the inorganic barrier layers and the polymeric layers), deteriorating the optical properties and/or the integrity of the device.

Photoinitiators, which are used to start the monomer polymerization reaction, are a key component in UV-curable ink compositions. However, photoinitiator molecules and the by-products of their degradation reactions are a common source of volatile species in UV-cured polymeric films. Upon UV curing, particularly upon UV curing with monochromatic LED lamps in the A-UV range, a fraction of the photoinitiator in a UV-curable ink composition may remain unactivated by the UV-radiation. In addition, fragments of the activated photoinitiator molecules that do not become bound to the polymeric network can remain in the polymeric films as volatile species that are left free to migrate in the polymeric film and inside the multilayered encapsulation stack.

SUMMARY

The present teachings relate to processes for curing liquid organic polymer compositions which, once deposited and cured, form polymeric films, including organic encapsulation layers in organic light-emitting diode (OLED) devices. The processes use an initiate curing step, following by a UV plasma treatment step, to achieve a higher degree of curing, reduced outgassing through a reduction in the concentration of volatile photoinitiator species, or both.

One embodiment of a method of forming a polymeric film over an electronic device includes the step of forming a cured polymeric film over the electronic device, wherein the cured polymeric film: (a) is not fully cured; or (b) comprises unreacted cure initiator molecules, fragments of cure initiator molecules, or a combination thereof; or (c) both (a) and (b). Once they are formed, the cured polymeric films are exposed to an ultraviolet plasma for a period sufficient to: (i) increase the cure degree in the cured polymeric film; or (ii) decrease the outgassing of fragments of cure initiator molecules from the cured polymeric film; or (iii) both (i) and (ii).

BRIEF DESCRIPTION OF THE DRAWINGS

Illustrative embodiments of the invention will hereafter be described with reference to the accompanying drawings.

DETAILED DESCRIPTION

Methods for increasing the degree of curing and/or reducing the volatile cure initiator concentration in cured polymer film, and particularly in cured polymeric films in a multilayered thin film encapsulation stack are provided. Also provided are highly cured and/or low-outgassing thin polymeric films and encapsulation stacks made using the methods.

UV cured polymeric films that may benefit from the UV plasma treatments include the organic polymeric films in thin film encapsulation stacks for electronic devices, such as OLEDs. When used as part of an encapsulation stack, the polymeric films are disposed over an electronic device to protect the device from degradation by reactive species such as, but not limited to, water vapor, oxygen, and various solvent vapors from device processing. Such degradation can negatively impact the stability and reliability of an electronic device. The encapsulation stacks can be disposed over an active region, such as a light-emitting region, of an electronic device. The encapsulation stack includes a film of an inorganic barrier layer adjacent to a polymeric film that serves as a planarizing layer to planarize and mechanically protect the active region of the underlying device. Examples of inorganic materials useful for fabricating inorganic barrier layers in an encapsulation stack can include various inorganic oxides, such as one or more of $SiN_x$, $SiO_2$, $Al_2O_3$, $TiO_2$, $HfO_2$, $SiO_xN_y$ or one or more other materials. An encapsulation stack will include at least one such inorganic barrier layer/polymeric planarizing layer pair ("dyad") but can include multiple stacked dyads.

Figure 1:
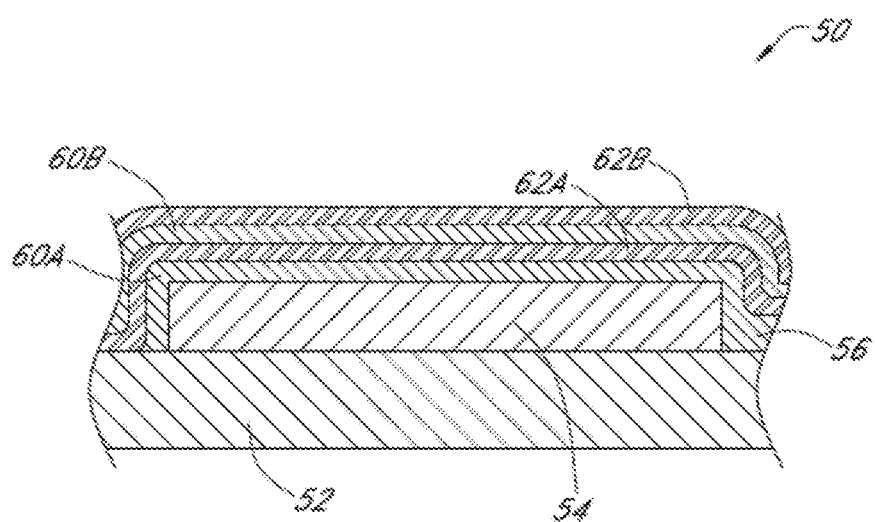
FIG. 1 is a schematic cross-sectional view of a thin film encapsulation stack over an electronic device.

FIG. 1 shows an embodiment of an encapsulation stack disposed over an electronic device, such as an OLED. The electronic device 50 is disposed on substrate a 52. Various embodiments of a substrate can include, for example, a thin silica-based glass, as well as any of a number of flexible polymeric materials. For example, substrate 52 can be transparent, such as for use in a bottom-emitting optoelectronic device (e.g., OLED) configuration. In embodiments in which the electronic device is an OLED, the device includes one or more organic layers that provide an active region 54, such as an electroluminescent region of the OLED. The organic layers can include charge transport layers, charge injection layers, and a light-emitting layer sandwiched between an anode electrode and a cathode electrode, one of which can be coupled to or can include electrode portion 56 that is laterally offset along the substrate 52 from the active region 54.

As depicted in the illustrative embodiment of FIG. 1, an inorganic barrier layer 60A of an encapsulation stack can be provided on electronic device 50 over active region 54. For example, the inorganic barrier layer can be blanket coated (e.g., deposited) over an entirety, or substantially an entirety, of a surface of the substrate 52, including active region 54, using, by way of a non-limiting example, plasma-enhanced chemical vapor deposition (PECVD). Adjacent to inorganic barrier layer 60A is polymeric film 62A. Polymeric film 62A can serve as a planarizing layer to planarize and mechanically protect the active region 54, as part of an encapsulation stack that collectively serves to suppress or inhibit moisture or gas permeation into the active region 54. FIG. 1 illustrates generally a multilayered encapsulation stack configuration having a first inorganic barrier layer 60A, a first polymeric film 62A, a second inorganic barrier layer 60B, and a second polymeric film 62B. However, the order of the fabrication of the layers in the encapsulation stack depicted in FIG. 1 could be reversed, so that a polymeric planarizing layer is first fabricated, followed by the fabrication of an inorganic barrier layer. Additionally, greater or fewer numbers of dyads can be present. For example, a stack having inorganic barrier layers 60A and 60B as shown, and a single polymeric planarizing layer 62A, can be fabricated.

Electronic devices that can be protected using an encapsulation stack include optoelectronic devices, such as OLEDs. The encapsulation stacks can be placed over and/or around the entire device or over and/or around only a portion of the device. The lowermost layer in the encapsulation stack, which is in contact with at least one substrate of the electronic device, can be either an inorganic barrier layer or a polymeric planarizing layer. Thus, by way of illustration, a polymeric film that is disposed over a light-emitting active region of an OLED need not be formed directly on the light-emitting active region. For example, the polymeric film can be formed on one of the electrodes between which the light-emitting active region is disposed, on an inorganic barrier layer that forms part of an encapsulation stack, and/or on the surface of an OLED support substrate.

As described in greater detail below, a first aspect of the invention provides a two-step processing method that provides a cured polymeric film with a higher cure degree than does a single-step UV cure and a second aspect of the invention provides a two-step processing method that provides a cured polymeric film with a lower degree of post-processing outgassing than does a single-step UV cure. However, it should be understood that for some cured polymeric films, both aspects of the invention are provided together, such that a higher cure degree and lower post-processing outgassing are achieved together.

The polymeric films are formed from curable ink compositions that typically include one or more primary film-forming monomers, one or more multifunctional crosslinking agents, and one or more cure initiators, such as one or more photoinitiators. The compositions that are used to form the polymeric films are referred to as "ink compositions" because various embodiments of the compositions can be applied using techniques, including printing techniques, by which conventional inks have been applied to substrates. Such printing techniques include, for example, inkjet printing, screen printing, thermal transfer printing, flexographic printing, and/or offset printing. However, various embodiments of the ink compositions can also be applied using other coating techniques, such as, for example, spray coating, spin coating, and the like. Moreover, the ink compositions need not contain colorants, such as dyes and pigments, which are present in some conventional ink compositions.

The polymeric films are formed by applying a UV-curable ink composition onto a substrate, such as an electronic device substrate, and curing the ink composition to form the polymeric film. Some of the deposition techniques by which the ink compositions can be applied include precision deposition techniques. Precision deposition techniques are techniques that apply the ink compositions to a substrate with a high degree of precision and accuracy with respect to the quantity, location, shape, and/or dimensions of the printed ink compositions and the cured polymeric films that are formed therefrom. The precision deposition techniques are able to form blanket coatings of the ink compositions or patterned coatings of the ink compositions that, once cured, form thin polymeric films with highly uniform thicknesses and well-defined edges. As a result, the precision deposition coating techniques are able to provide thin polymeric films that meet the requirements of a variety of organic electronic and organic optoelectronic device applications. The required quantity, location, shape, and dimensions for a given precision deposited ink composition and the cured film formed therefrom, will depend on the intended device application. By way of illustration, various embodiments of the precision deposition techniques are able to form blanket or patterned films having a thickness of no greater than 10 μm with a thickness variation of no more than 5% across the film. Inkjet printing is one example of a precision deposition technique.

Regarding inkjet printing of the curable ink compositions, an industrial inkjet printing system that can be housed in an enclosure configured to provide a controlled processing environment can be used. Inkjet printing for the deposition of the curable ink compositions can have several advantages. First, a range of vacuum processing operations can be eliminated, as inkjet-based fabrication can be performed at atmospheric pressure. Additionally, during an inkjet printing process, an ink composition can be localized to cover portions of an electronic device substrate, including portions that are over and proximal to an active region, and/or to effectively encapsulate an active region, including the lateral edges of the active region. The targeted patterning using inkjet printing results in eliminating material waste, as well as eliminating additional processing typically required to achieve patterning of a polymeric film, as required, for example, by various masking techniques. Ink compositions can be printed using, for example, a printing system, such as described in U.S. Pat. No. 9,343,678, which is incorporated herein in its entirety. Various embodiments of the ink compositions can be inkjet printed on such substrates as glass, plastics, silicon, and silicon nitride.

Once applied to a substrate, the ink compositions can be cured in the first step of the two-step process using a variety of curing techniques, including UV curing, thermal curing, or electron-beam curing. If UV curing is used, an ink composition on a substrate surface can be exposed to ultraviolet radiation from a non-plasma-based UV source in an inert environment in a UV cure chamber. For example, the UV cure can be carried out under nitrogen ($N_2$). However, the UV cure can also be carried out under other inert gases, such as noble gases. The UV radiation is desirably high intensity UV radiation, having an intensity of at least 25 $mW/cm^2$ in order to provide a relatively fast full or partial cure. For example, UV radiation intensities of at least 50 $mW/cm^2$, at least 100 $mW/cm^2$, and at least 200 $mW/cm^2$ can be used. By way of illustration, in various embodiments of the curing processes of the first step, the intensity of the UV radiation used in the UV cure step is in the range from about 25 $mW/cm^2$ to 1000 $mW/cm^2$. The light source used to activate photoinitiators and induce the crosslinking of the monomers during the UV cure step is desirably selected such that the absorbance range of the photoinitiator matches or overlaps with the output of the light source, whereby absorption of the light creates free radicals that initiate polymerization. Suitable light sources may include narrow spectrum UV light sources, such as UV light emitting diodes (LEDs). For the purpose of this disclosure, a narrow spectrum UV light source is one that has a full-width half maximum (FWHM) of no greater than 100 nm. This includes narrow spectrum UV light sources having FWHMs of no greater than 50 nm, no greater than 40 nm, and no greater than 20 nm. For example, the ink compositions can be cured using a monochromatic UV-LED source at 395 nm, which is standard in the OLED industry. However, other non-plasma UV sources can be used, including those that emit UV radiation in the wavelength range between about 365 nm and about 420 nm.

After the initial cure of the first step, the resulting polymeric film undergoes plasma treatment in a low pressure, sub-atmospheric plasma in a vacuum chamber. The plasma may be an inert gas plasma, and the plasma treatment may be a stand-alone processing step that does not entail any material deposition. Alternatively, the plasma treatment may be part of a plasma-aided deposition process, such as plasma-enhanced chemical vapor deposition (PECVD), sputtering, or plasma-enhanced atomic layer deposition (PE-ALD). For example, the plasma treatment step may occur as part of the plasma-aided deposition of an inorganic barrier layer onto the polymeric film to form a thin film encapsulation stack.

The length of time during which the polymer composition is exposed to the plasma (the plasma exposure time) is desirably long enough to achieve the desired degree of curing and/or the desired degree of outgassing reduction. By way of illustration only, plasma exposure times of 50 seconds or longer may be employed. This includes plasma exposure times of 100 seconds or longer.

Increasing the Cure Degree in a Cured Polymeric Film.

In a first aspect of the invention, the two-step processing is used to increase the degree of cure in a cured polymeric film that has not reached its full or maximum degree of cure during the initial curing step. In a basic embodiment of a two-step curing process in accordance with this aspect of the invention, a UV curable ink composition that has been applied to a substrate by, for example, inkjet printing is partially cured by exposing the ink composition to UV radiation in an inert environment in a first step. In a separate step, the partially cured ink composition undergoes a plasma process, which increases its degree of curing and, therefore, increases the environmental stability of the resulting polymeric thin film. As used herein, the degree of curing, or cure degree, is a measure of the extent of crosslinking that has occurred between the monomers that make up the films.

In a conventional UV curing process, a high intensity UV radiation source can be used to achieve a short takt time. However, the use of high intensity UV radiation can lead to fast vitrification of the ink composition as it cures into a film. For some acrylate-based ink compositions, this fast vitrification limits the degree of curing that is achieved by the UV cure alone. An alternative to UV curing is plasma curing. However, when a plasma cure is carried out on a liquid composition, the high energy species (e.g., ions and radicals) can lead to poor film morphology, including a high surface roughness. The two-step cure improves upon single-step UV and single-step plasma cures by combining a fast tact time with a high degree of curing, without introducing the surface roughness that characterizes certain plasma-cured polymeric films. Other possible benefits may include less film outgassing and chamber contamination by volatile components, such as photoinitiator fragments (if such fragments are present), as discussed in more detail with respect to the second aspect of the invention, and/or reduced dwelling time of the liquid polymer composition on the device substrate.

Although the two-step cure can be used to increase curing in a variety of UV curable ink compositions, it is particularly suited for use with acrylate-based ink compositions in which the degree of curing (cure degree) that can be achieved with a short UV cure is no greater than 85%. For some of the ink compositions, this limited degree of curing is achieved with a short, high-intensity UV cure, such as a short UV cure at UV radiation intensities of 25 $mW/cm^2$ and higher. This upper limit to the cure degree may apply even at long UV cure times, as the degree of curing for acrylate-based inks typically levels off after a maximum cure degree has been achieved. Examples of ink compositions that may achieve a cure degree of less than 85% using a high-intensity UV cure alone include ink compositions that comprise a significant amount of multifunctional (meth)acrylate monomer as, for example, a crosslinking agent. As used herein, the phrase "(meth)acrylate monomer" indicates that the recited monomer may be an acrylate or a methacrylate. As used herein, the term multifunctional (meth)acrylate monomer refers to (meth)acrylate monomers having three or more acrylate groups, such as tri(meth)acrylate monomers and tetra(meth)acrylate monomers. (Meth)acrylate monomers having only two acrylate groups are referred to herein as di(meth)acrylates. By way of illustration only, ink compositions that comprise a significant amount of multifunctional (meth)acrylate monomer include those ink compositions having a multifunctional (meth)acrylate monomer content of at least 2 mol. %. This includes ink compositions having a multifunctional (meth)acrylate monomer content of at least 5 mol.

% and further includes ink compositions having a multifunctional (meth)acrylate monomer content of at least 8 mol. %.

The length of time during which the ink composition is exposed to the UV radiation (the UV exposure time) during the first cure step is desirably short in order to reduce or minimize the tact time for the process. UV exposure times of 10 seconds or shorter may be employed. This includes exposure times of 5 seconds or shorter.

During the short, high-intensity UV curing step, the ink composition is partially cured. The cure degree of the partially cured ink composition will typically be lower than 90% and, more typically, 85% or lower. For example, in some embodiments of the two-step curing processes, the ink composition has a cure degree in the range from about 65% to about 83% after the initial UV cure, but before the curing that takes place during the plasma treatment of the second step. The cure degree can be measured via Fourier Transform Infrared (FTIR) spectroscopy or via Raman spectroscopy.

When the partially cured ink composition is exposed to a plasma during the second step of the process, additional monomer curing takes place. The partially cured films are preferred for a subsequent plasma processing because they have a lower elastic modulus than the fully cured films and, therefore, are more compliant. This makes the partially cured films better able to accommodate interfacial stress that can build up in the deposition of inorganic films by plasma processes, such as a PECVD. As a result, the various embodiments of the polymeric thin films that are formed using the two-step cure can have improved adhesion to the substrate and/or lower surface roughness relative to corresponding films formed with a single-step plasma cure alone. By way of illustration, some embodiments of the polymeric thin films formed from the ink compositions via the two-step cure process of the first aspect of the invention have a root mean squared (RMS) surface roughness of no greater than 10 nm, as measured by optical profilometry. This includes embodiments of the polymeric thin films having a RMS surface roughness of no greater than 5 nm; further includes embodiments of the polymeric thin films having a RMS surface roughness of no greater than 2 nm; and still further includes embodiments of the polymeric thin films having a RMS surface roughness of no greater than 1 nm.

During the second step of the cure, plasma exposure supplies energy to the partially cured film via broad spectrum UV irradiation and thermal heating. Although the UV irradiation and heating separately would have little or no effect on the curing of a partially cured film, together they act synergistically to increase the degree of curing. UV radiation may activate the photoinitiator present in the partially cured film and initiate new reactions, leading to polymer chain formation and cross-linking. Heating the partially cured ink composition increases chain mobility, allowing for better interaction of radicals with the monomers and, thus, a more complete cure. This reduces free volume in the cured polymer film and, as a consequence, reduces water diffusion and solubility in the polymer film. As a result, the performance of a thin film encapsulation stack that incorporates the thin film can be improved.

Although the cure degree of the polymeric thin film after the plasma cure step can vary, depending on the particular monomers present in the ink composition, the cured thin films will generally have a cure degree of at least 90%, as measured by FTIR. This includes embodiments of the cured thin films that have a cure degree of at least 92%, and further includes embodiments of the thin films that have a cure degree of at least 93%. The degree of curing can be increased and/or the plasma exposure time can be decreased by increasing the temperature of the substrate upon which the ink compositions are printed. By way of illustration, the substrate temperature during the plasma processing step can be 70° C. or higher. This includes substrate temperatures of 100° C. or higher. For example, the plasma processing step can be carried out using substrate temperatures in the range from about 100° C. to 120° C.

Decreasing Outgassing from a Cured Polymeric Film.

In a second aspect of the invention, two-step processing is used to decrease the degree of outgassing by a cured polymeric film relative to a cured polymeric film that is cured in single-step cure. Polymeric films that contain volatile cure initiator species can benefit from this two-step processing even if they have reached their full or maximum degree of cure during the initial curing step.

This aspect of the invention uses a post-cure, UV plasma treatment to reduce the concentration of volatile initiator species in a cured polymeric film. The volatile initiator species may be intact cure initiator molecules, cure initiator fragments, or a mixture thereof. Most commonly, the initiators will be photoinitiators that are activated by UV radiation. However, other types of cure initiators, including thermal initiators, can be used along with, or instead or, the photoinitiators. The outgassing from polymeric films that include thermal initiator species can be reduced by the plasma treatment if the thermal initiators can be activated by heat and UV radiation, or if the heat generated by the plasma activates the thermal initiators.

In various embodiments of the methods, a cured polymeric film that contains unreacted photoinitiator molecules, free photoinitiator fragments, or a combination thereof, is exposed to a UV plasma. The UV plasma radiation is absorbed by volatile photoinitiator species in the film, causing unreacted photoinitiator molecules to undergo photopolymerization reactions and/or causing free photoinitiator fragments to become covalently bonded to the polymeric film. As a result, the outgassing of the polymeric film is reduced. In addition, the degree of curing in the plasma-treated polymeric films can be increased, relative to their non-plasma-treated counterparts, as described in conjunction with the first aspect of the invention. Thus, by using the post-cure plasma treatment, the same degree of cure may be attained with a lower concentration of photoinitiator.

When the partially cured ink composition is exposed to a plasma that emits broad spectrum UV radiation during a plasma treatment in the second step of the process, photoinitiator molecules that were not activated during the initial cure are activated by the plasma and/or volatile photoinitiator fragments that had not previously become covalently bound to the polymeric network become bound and immobilized, preventing them from migrating within the polymeric film and the thin film encapsulation stack. The plasmas are an effective source of UV radiation and are a better match for the broadband absorption spectra of many photoinitiators than is the monochromatic UV-A radiation that is commonly used to cure the planarizing layers in thin films used for device encapsulation.

As a result of the reduction in volatile species, the outgassing from the film is reduced, where outgassing reduction can be measured using Automated Thermal Desorption-Gas-Chromatograph-Mass Spectrometry (ATD-GC-MS). For example, the extent of outgassing, as measured by ATD-GC-MS, can be reduced by a factor of five or more, or even by a factor of ten or more, by using the two-step cure rather than a single-step cure.

Ink Compositions.

The primary film-forming monomers in the ink compositions from which the polymeric layers are formed will generally be di-functional monomers that make up the majority component in the ink compositions. Examples of primary film-forming monomers include di(meth)acrylate monomers. However, mono(meth)acrylate monomers can also be included in a primary monomer mixture. As used herein, the phrase "(meth)acrylate" indicates that the recited component may be an acrylate, methacrylate, or combinations thereof. For example, the term "(meth)acrylate monomer" refers to both methacrylate monomers and acrylate monomers.

The di(meth)acrylate and mono(meth)acrylate monomers are ether and/or ester compounds that have thin film-forming properties and spreading properties that render them suitable for use film-forming applications, such as in inkjet printing applications. As components of various embodiments of the ink compositions, these monomers can provide compositions that are jettable at a range of inkjet printing temperatures, including room temperature. Generally, for ink compositions useful for inkjet printing applications, the surface tension, viscosity, and wetting properties of the ink compositions should be tailored to allow the compositions to be dispensed through an inkjet printing nozzle without drying onto or clogging the nozzle at the temperature used for printing (e.g., room temperature, 22° C., or at higher temperatures up to, for example, about 40° C.). Once formulated, various embodiments of the ink compositions can have a viscosity of, for example, between about 2 cps and about 30 cps, including, for example, between about 5 cP and 12 cP, between about 10 cps and about 27 cps, or between about 14 cps and about 25 cps, at 22° C.; and a surface tension of between about 25 dynes/cm and about 45 dynes/cm, including, for example, between about 30 dynes/cm and about 42 dynes/cm, and between about 28 dynes/cm and about 38 dynes/cm at 22° C.

The suitable viscosities and surface tensions for the individual monomers used in the ink compositions will depend on the viscosities and surface tensions for the other components present in a given ink composition and on the relative amounts of each component in the ink composition. Generally, however, the di(meth)acrylate monomers and the mono(meth)acrylate monomers will have a viscosity in the range from about 1 cps to about 22 cps at 22° C., including about 4 cps to about 18 cps at 22° C.; and a surface tension in the range from about 30 dynes/cm to 41 dynes/cm at 22° C., including in the range from about 32 dynes/cm to 41 dynes/cm at 22° C. Methods for measuring viscosities and surface tensions are well known and include the use of commercially available rheometers (e.g., a DV-I Prime Brookfield rheometer) and tensiometers (e.g., a SITA bubble pressure tensiometer).

A variety of di(meth)acrylate monomers and mono(meth)acrylate monomers may be present in the ink compositions. The di(meth)acrylate monomers and mono(meth)acrylate monomers can be, for example, linear aliphatic di(meth)acrylates and mono(meth)acrylates, or can include cyclic and/or aromatic groups. In various embodiments of the ink compositions, the di(meth)acrylate monomers and/or mono(meth)acrylate monomers are polyethers. This includes alkyl di(meth)acrylates. The alkyl portion of an alkyl di(meth)acrylate monomer can be between, for example, 3 to 21 methyl groups, including between 3 to 14 methyl groups, and further including between 6 to 12 methyl groups. An exemplary alkyl di(meth)acrylate monomer is 1,12 dodecanediol dimethacrylate (DDMA). Various embodiments of the ink compositions can include between about 50 mol. % to about 90 mol. % of 1,12 dodecanediol dimethacrylate monomer. Other di(meth)acrylate monomers that can be used in the ink compositions in addition to, or instead of, DDMA include decanediol di(meth)acrylate, dodecanediol di(meth)acrylate, 1,6-hexanediol diacrylate and mixtures thereof. Tricyclodecanedimethanol diacrylate is another example.

The di(meth)acrylates and mono(meth)acrylates can also be urethane di(meth)acrylates and urethane mono(meth)acrylates, such as urethane dimethacrylate; and/or siloxane di(meth)acrylates and mono(meth)acrylates, such as methacryloxy polydimethylsiloxane and/or monomethacryloxypropyl polydimethyl siloxane.

The di(meth)acrylate monomers can also be, for example, alkoxylated aliphatic di(meth)acrylate monomers. These include neopentyl glycol group-containing di(meth)acrylates, including alkoxylated neopentyl glycol diacrylates, such as neopentyl glycol propoxylate di(meth)acrylate and neopentyl glycol ethoxylate di(meth)acrylate. Various embodiments of the neopentyl glycol group-containing di(meth)acrylates have molecular weights in the range from about 200 g/mole to about 400 g/mole. This includes neopentyl glycol-containing di(meth)acrylates having molecular weights in the range from about 280 g/mole to about 350 g/mole and further includes neopentyl glycol-containing di(meth)acrylates having molecular weights in the range from about 300 g/mole to about 330 g/mole. Various neopentyl glycol group-containing di(meth)acrylate monomers are commercially available. For example, neopentyl glycol propoxylate diacrylate can be purchased from Sartomer Corporation under the tradename SR9003B and also from Sigma Aldrich Corporation under the tradename Aldrich-412147 (~330 g/mole; viscosity ~18 cps at 24° C.; surface tension ~34 dynes/cm at 24° C.). Neopentyl glycol diacrylate also can be purchased from Sigma Aldrich Corporation under the tradename Aldrich-408255 (~212 g/mole; viscosity ~7 cps; surface tension ~33 dynes/cm).

Suitable mono(meth)acrylates that can be included in the ink compositions include: alkyl (meth)acrylates, such as lauryl (meth)acrylate, methyl (meth)acrylate, ethyl (meth)acrylate; cyclic (meth)acrylates, such as isobornyl (meth)acrylate, tetrahydrofurfuryl methacrylate, alkoxylated tetrahydrofurfuryl (meth)acrylate, 3,3,5 trimethylcyclohexyl methacrylate, cyclic trimethylolpropane formal (meth)acrylate; and aromatic (meth)acrylates, such as benzyl (meth)acrylate and phenoxyalkyl (meth)acrylates, including 2-phenoxyethyl (meth)acrylate and phenoxymethyl (meth)acrylate.

Still other mono(meth)acrylate monomers that can be included in various embodiments of the ink compositions, alone or in combination, include 2-[[(butylamino)carbonyl]oxy]ethyl acrylate, dicyclopentenyloxyethyl acrylate (DC-POEA), dicyclopentenyloxyethyl methacrylate (DC-POEMA), and N-octadecyl methacrylate (OctaM).

In various other embodiments of the ink compositions, the (meth)acrylate monomers are glycol ether (meth)acrylate monomers. These include ethylene glycol phenyl (meth)acrylate (EGPE(M)A), di(ethylene glycol) methyl ether (meth)acrylate (DEGME(M)A), diethylene glycol monoethyl ether acrylate, ethylene glycol methyl ether (meth)acrylate (EGME(M)A), 1,3-butylene glycol di(meth)acrylate, and polyethylene glycol di(meth)acrylate. The polyethylene glycol di(meth)acrylate monomers include polyethylene glycol di(meth)acrylate monomers having a number average molecular weight in the range from, for example, about 230 g/mole to about 440 g/mole. For example, the ink compositions can include polyethylene glycol 200 dimethacrylate and/or polyethylene glycol 200 diacrylate, having a number average molecular weight of about 330 g/mole.

In addition to the primary film-forming monomers, various multifunctional monomer crosslinking agents, such as multifunctional (meth)acrylate crosslinking agents, can be included in the curable ink compositions. As used herein, the term multifunctional crosslinking agent refers to a crosslinking agent having at least three reactive crosslinkable groups. Thus, the multifunctional (meth)acrylate crosslinking agents can be, for example, tri(meth)acrylates, tetra(meth)acrylates, as well as higher functionality (meth)acrylates. For example, the curable ink compositions can include trimethylolpropane tri(meth)acrylate and pentaerythritol tetra(meth)acrylate, as well as combinations thereof.

Cure initiators that can be included in the ink compositions include photoinitiators and/or thermal initiators. Suitable photoinitiators include Type I and Type II photoinitiators. Type I photoinitiators undergo radiation-induced cleavage (fragmentation) to generate two free radicals, one of which is reactive and initiates polymerization. Type II photoinitiators undergo a radiation-induced conversion into an excited triplet state. The molecules in the excited triplet state then react with molecules in the ground state to produce polymerization initiating radicals.

The specific photoinitiators used for a given curable ink composition are desirably selected such that they are activated at wavelengths that are not damaging to the underlying device materials. For this reason, various embodiments of the curable ink compositions include photoinitiators that have a primary absorbance with a peak in the range from about 365 nm to about 420 nm. The light source used to activate the photoinitiators and induce the initial polymerization of the monomers in the curable ink compositions is desirably selected such that the absorbance range of the photoinitiator matches or overlaps with the output of the light source, whereby absorption of the light creates free radicals that initiate polymerization. Suitable light sources may include mercury arc lamps and light emitting diodes.

An acylphosphine oxide photoinitiator can be used, though it is to be understood that a wide variety of photoinitiators can be used. For example, photoinitiators from the α-hydroxyketone, phenylglyoxylate, and α-aminoketone classes of photoinitiators can also be employed. For initiating a free-radical based polymerization, various classes of photoinitiators can have absorption profiles of between about 200 nm to about 400 nm. For various embodiments of the curable ink compositions, 2,4,6-trimethylbenzoyl-diphenylphosphine oxide (TPO) and 2,4,6-trimethylbenzoyl-diphenyl phosphinate have desirable properties. Examples of acylphosphine photoinitiators include Omnirad® TPO (also previously available under the tradename Lucirin® TPO) initiators for curing with optical energy in the wavelength range of about 365 nm to about 420 nm. These include Omnirad® TPO, a type I hemolytic initiator; with absorption @ 380 nm; Omnirad® TPO-L, a type I photoinitiator that absorbs at 380 nm; and Omnirad® 819 with absorption at 370 nm. By way of non-limiting example, a light source emitting at a nominal wavelength in the range from 350 nm to 395 nm at a radiant energy density of up to 2.0 J/cm$^2$ could be used for the initial (non-plasma-based) curing of the monomers in a curable ink composition comprising a TPO photoinitiator. Other examples of photoinitiators include bis-acylphosphine oxide (BAPO; phosphine oxide, phenyl bis(2,4,6-trimethylbenzoyl)), for curing with optical energy in the wavelength range of 360 nm to 420 nm.

Camphorquinone (CQ) is an example of a Type II photoinitiator for curing with optical energy in the wavelength range from 400 nm to 550 nm, with a maximum energy absorption around 468 nm. Phenanthrenequinone (PQ) has a maximum energy absorption around 420 nm.

Thermal initiators that can be included in the ink composition include tert-amyl peroxybenzoate, tert-butyl peracetate, perfluorooctanesulfonyl fluoride, 1,1'-azobis(cyclohexanecarbonitrile), tert-butyl peroxybenzoate, t-butylperoxy 2-ethylhexanoate, 2,2'-azobis(2-methylpropionitrile), 2,2-bis(tert-butylperoxy)butane, and 2,4-pentanedione peroxide.

The relative amounts of the various components in the curable ink compositions can be tailored to render them suitable for a selected deposition method by providing the proper viscosities, surface tensions and/or rheology, and to provide the cured films with appropriate properties for their intended applications, including optical properties, dimension stability upon curing, thermomechanical properties, water/oxygen diffusivity resistance, and/or plasma resistance. In some embodiments of the ink compositions, di(meth)acrylate monomers or a mixture of di(meth)acrylate and mono(meth)acrylate monomers make up from about 64 mol. % to about 98 mol. % of the composition (including from about 75 mol. % to about 98 mol. %); tri(meth)acrylate monomer, tetra(meth)acrylate monomer, or a combination thereof, make up about 1 mol. % to about 26 mol. % of the composition; and photoinitiator makes up about 1 mol. % to about 10 mol. % of the films.

By way of illustration only, some embodiments of the ink compositions have the formulations shown in Table 1.

TABLE 1

| Component | Mol. % (Range) |
|---|---|
| 1,12 Dodecanediol Dimethacrylate (DDMA) | 64-97 |
| Pentaerythritol tetraacrylate (PET) | 1-13 |
| Trimethylolpropane Triacrylate (TMPTA) | 1-13 |
| Ethyl (2,4,6-trimethylbenzoyl) phenylphosphinate (TPO) | 1-10 |
| Total | |

Other examples of UV-curable ink compositions that can be used to form polymeric films include those described in U.S. patent publications US 2016/0024322 and US 2017/0062762, the disclosures of which are incorporated herein by reference.

EXAMPLES

Example 1: Increasing the Degree of Cure

Figure 2:
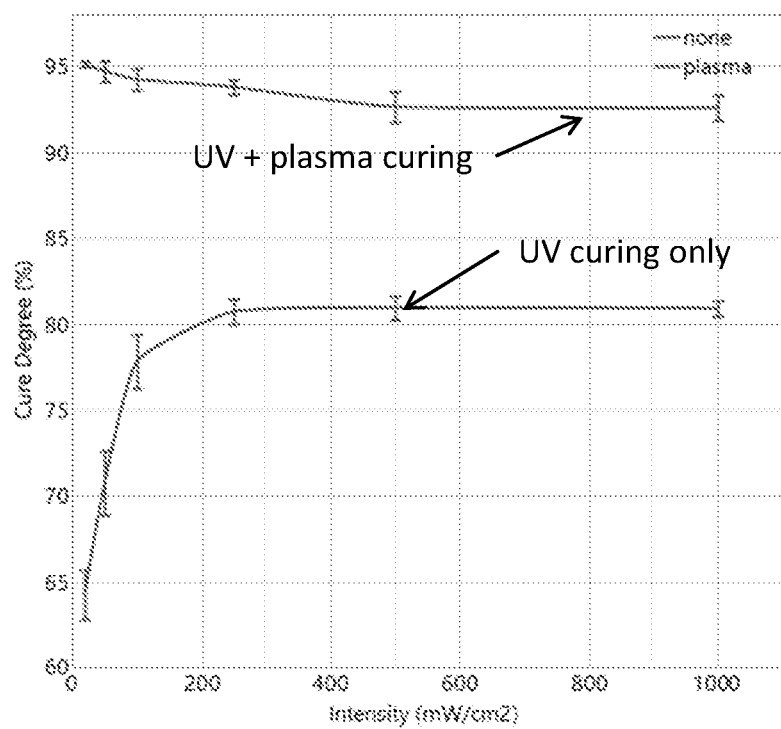
FIG. 2 is a graph of the Cure Degree for an acrylate-based, UV-cured film showing the Cure Degree as a function of UV intensity after a single-step UV cure and after a two-step UV cure and plasma treatment.

This example demonstrates the use of a two-step process to increase the degree of cure for an acylate-based polymeric film. The graph in FIG. 2 shows the degree of cure ("Cure Degree" (%)) as a function of UV radiation intensity for the ink composition of Table 2 after a UV cure step only (lower trace) and after a two-step cure (upper trace). As is evident from the graph, the two-step cure increases the cure degree from less than 85% to greater than 92% at all of the UV radiation intensities, as measured by FTIR. For this example, the first step UV cure was carried out in a nitrogen atmosphere using a UV lamp as a narrow spectrum radiation source and a UV exposure times of 3.6 s. In the second step of the two-step cure, the partially cured ink composition was exposed to a plasma using a pressure of 4 mTorr, an RF power of 1000 W, a plasma gas of Ar and $N_2$, a substrate temperature of 120 C, and a plasma exposure time of 315 s.

TABLE 2

| Component | Mol % |
|---|---|
| 1,12 Dodecanediol Dimethacrylate (DDMA) | 87.1 |
| Pentaerythritol tetraacrylate (PET) | 3.7 |
| Trimethylolpropane Triacrylate (TMPTA) | 4.9 |
| Ethyl (2,4,6-trimethylbenzoyl) phenylphosphinate (TPO) | 4.3 |
| Total | 100.0 |

Figure 3:
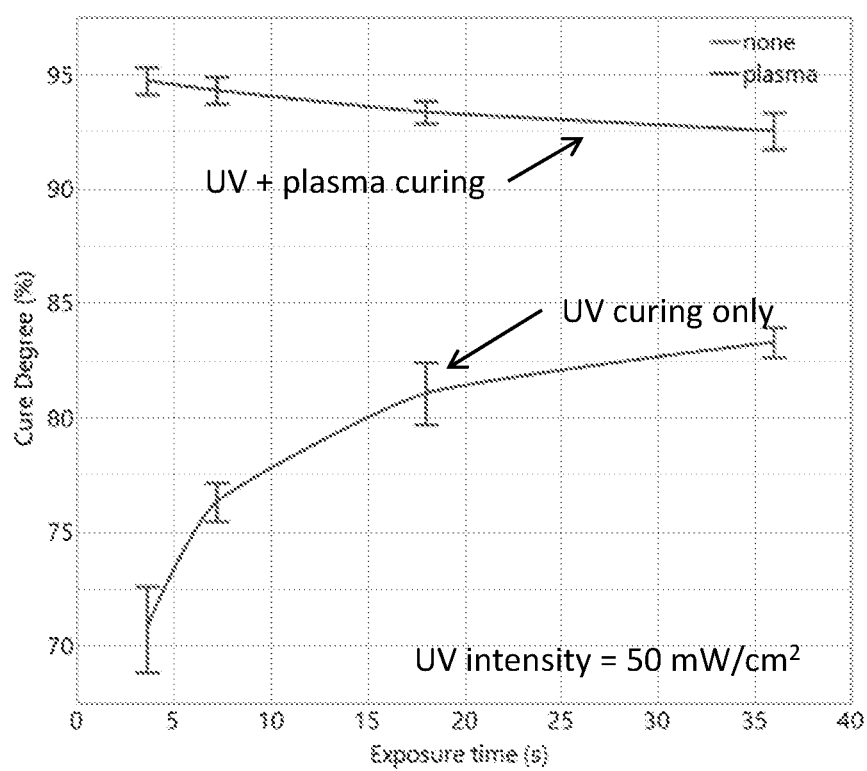
FIG. 3 is a graph of the Cure Degree for an acrylate-based, UV-cured film showing the Cure Degree as a function of exposure time after a single-step UV cure and after a two-step UV cure and plasma treatment.

The graph in FIG. 3 shows the Cure Degree as a function of UV exposure time at 50 mW/cm$^2$ UV intensity for the ink composition of Table 2. The lower trace shows data for the ink composition cured with a UV cure step only, while the upper trace shows data for the ink composition cured with a two-step cure that included both a UV cure and a subsequent plasma exposure. In comparison with FIG. 2, it can be seen in this case that the UV cure step did not saturate with exposure time. Even for a relatively long exposure time of 36 s, the cure degree only reached 83%. By adding a plasma exposure, the cure degree increased to >90%, similar to the data seen in FIG. 2.

Figure 4:
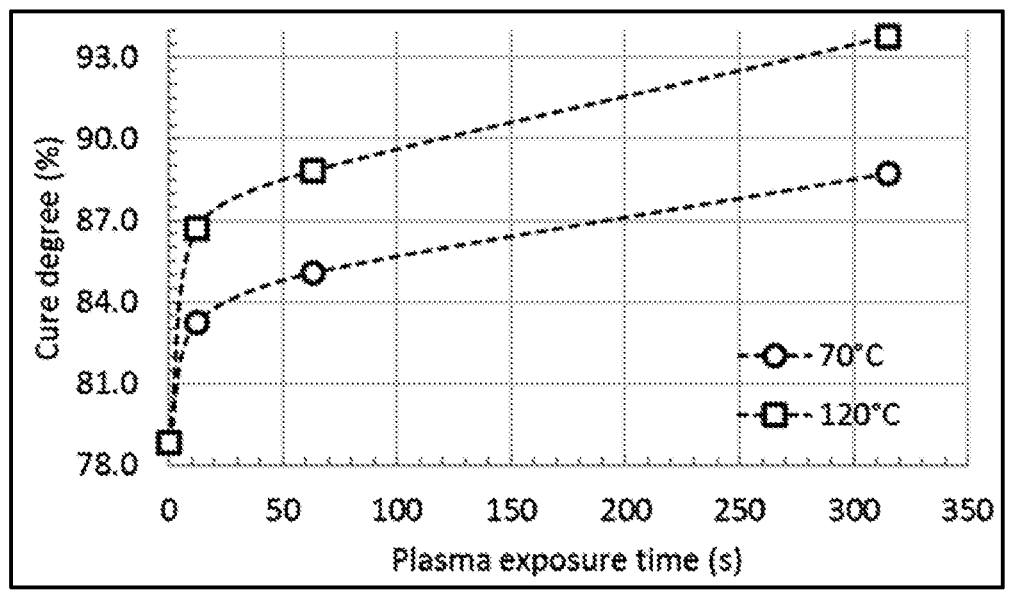
FIG. 4 is a graph of the Cure Degree for an acrylate-based, UV-cured film showing the Cure Degree as a function of exposure time after a two-step UV cure and plasma treatment at two different temperatures.

The graph in FIG. 4 shows the Cure Degree (%) as a function of plasma exposure time at two different substrate temperatures for the ink composition of Table 2 after two-step processing, and demonstrates the effect of the substrate temperature during the plasma exposure on the degree of curing in the final cured polymeric thin film. For this example, the UV cure of the first step was carried out in a nitrogen atmosphere using a UV lamp as a narrow spectrum radiation source with a UV intensity of 500 mW/cm$^2$ and a UV exposure times of 3.6 s. In the second step of the two-step cure, the partially cured ink composition was exposed to a plasma using a pressure of 4 mTorr, an RF power of 1000 W, a plasma gas of Ar and $N_2$, and a plasma exposure time of 315 s. Films which experienced plasma curing at 120° C. show a cure degree increase which is ≥5 percentage points higher compared to films which experienced plasma curing at 70° C.

Table 3 shows the Cure Degree and the extent of outgassing for the partially cured ink composition after the UV cure step and after the two-step cure for the ink composition cured using a substrate temperature of 120° C. As evident from the data, the two-step cure markedly increases the degree of curing and also dramatically decreases the extent of outgassing, indicating the concentration of unreacted photoinitiator is substantially reduced during the plasma process. The outgassing was measured via ATD-GC-MS.

TABLE 3

| Result | 1-step: UV | 2-step: UV + Plasma |
|---|---|---|
| Cure Degree | 82.1 ± 0.7% | 93.3 ± 0.2% |
| Outgassing | 4800 ± 300 ppm | 420 ± 180 ppm |

Example 2: Outgassing Reduction

This example illustrates the use of a plasma treatment step to reduce the outgassing of photoinitiator species and increase the degree of curing for a UV-cured acrylic polymeric film.

Figure 5:
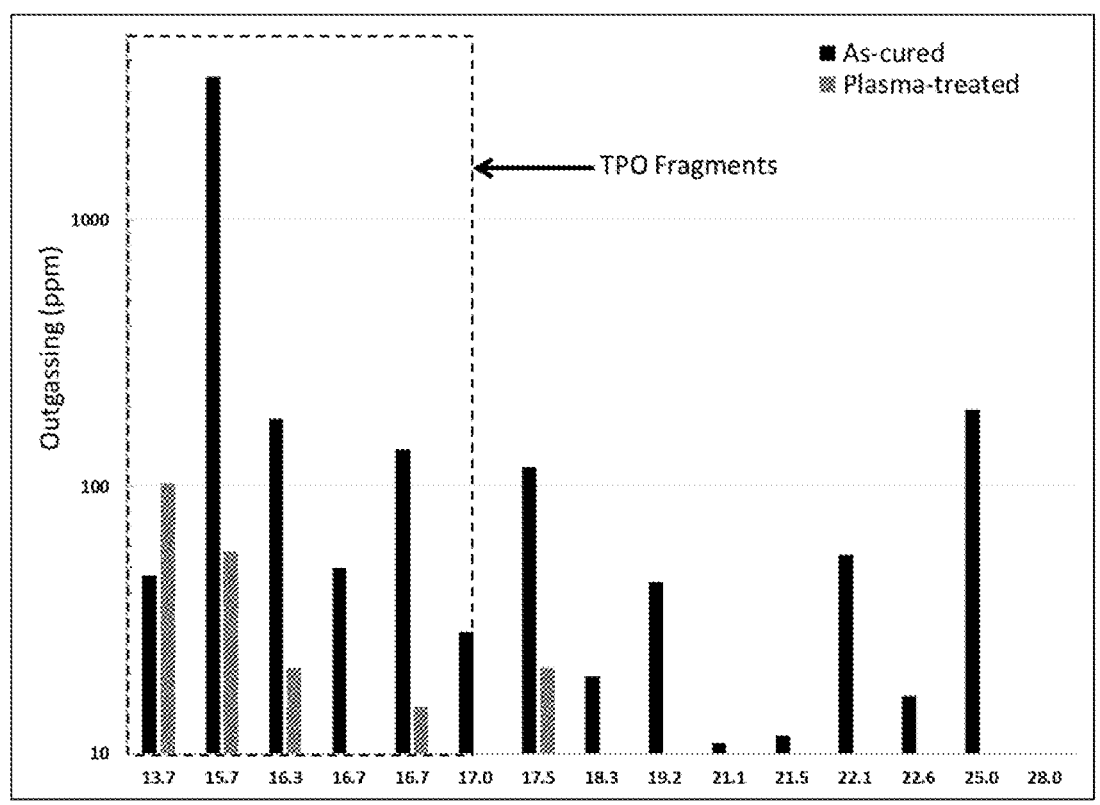
FIG. 5 is a graph of outgassing for an acrylate-based, UV-cured film showing outgassing as a function of retention time after a single-step UV cure and after a two-step UV cure and plasma treatment.

The graph in FIG. 5 shows the amount of outgassing (ppm), as measured by ATD-GC-MS, as a function of retention time for a polymeric film formed form the ink composition of Table 2 after a UV cure step only, and after subsequent plasma treatment. As used here, retention time refers to the length of time that the sample was held at a high temperature during which outgassing species were identified. The plasma conditions were the same as those used in Example 1. The shaded area at the left of the graph indicates the outgassing from TPO initiating fragments in the film. The outgassing at retention times greater than 17 s was due primarily or entirely to the outgassing of volatile non-initiator species from the polymeric film. As evident from the graph, the plasma treatment reduced the degree of TPO fragment outgassing by a factor of greater than ten. The TPO fragments that were detected by ATD-GC-MS included benzaldehyde, benzoic acid, phenol, 2,4-bis(1,1-dimethylethyl)-(Prodox 146), 6,7-dimethyl-3H-isobenzofuran-1-one, and 1,3-2H-isobenzofuranone, 4,7-dimethyl.

Figure 6:
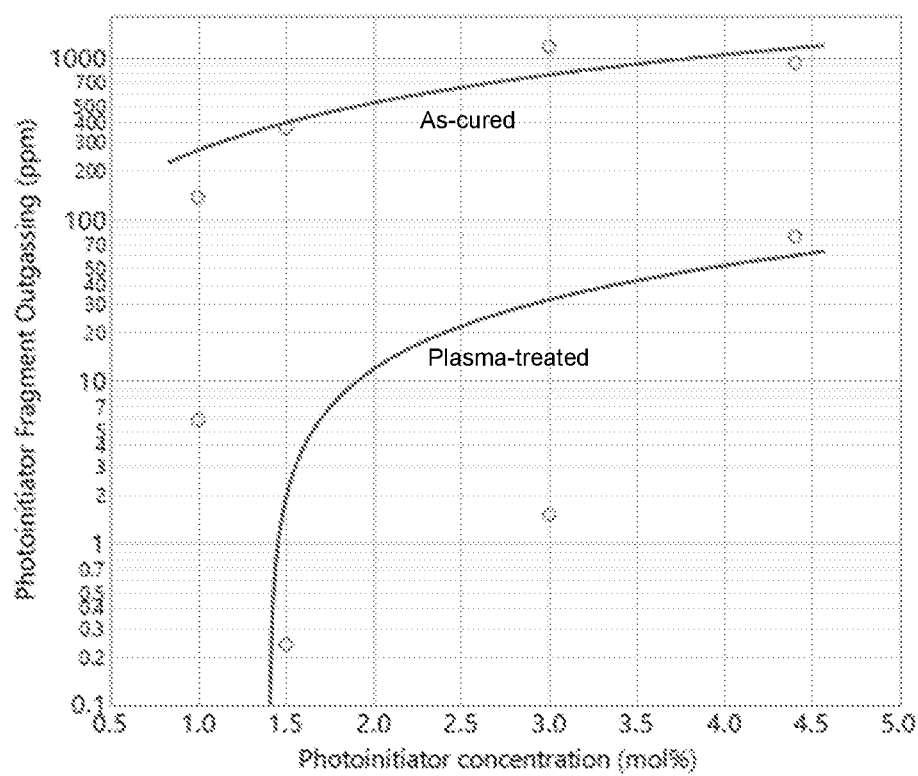
FIG. 6 is a graph of photoinitiator fragment outgassing for an acrylate-based, UV-cured film showing the outgassing as a function of the initial photoinitiator concentration after a single-step UV cure and after a two-step UV cure and plasma treatment.

The graph in FIG. 6 shows the amount of TPO fragment outgassing (ppm), as measured by ATD-GC-MS, as a function of the photoinitiator concentration in the ink composition used to form the polymeric films. The data show the outgassing concentration after a UV cure step only, and after UV cure and a subsequent plasma treatment. The lines in the graph represent linear fits by sample type. The ink composition with the highest TPO concentration was that of Table 2. Ink compositions with lower TPO concentration were formed by reducing the TPO concentration and increasing the concentration of the DDMA by a corresponding amount. As evident from the graph, the plasma treatment reduced the film TPO fragment outgassing for all of the TPO concentrations. The ATD-GC-MS measurements were taken between three day and one week after the plasma treatment. Since the samples were taken at room temperature, this difference in the duration had no effect on the results of the measurements.

Figure 7:
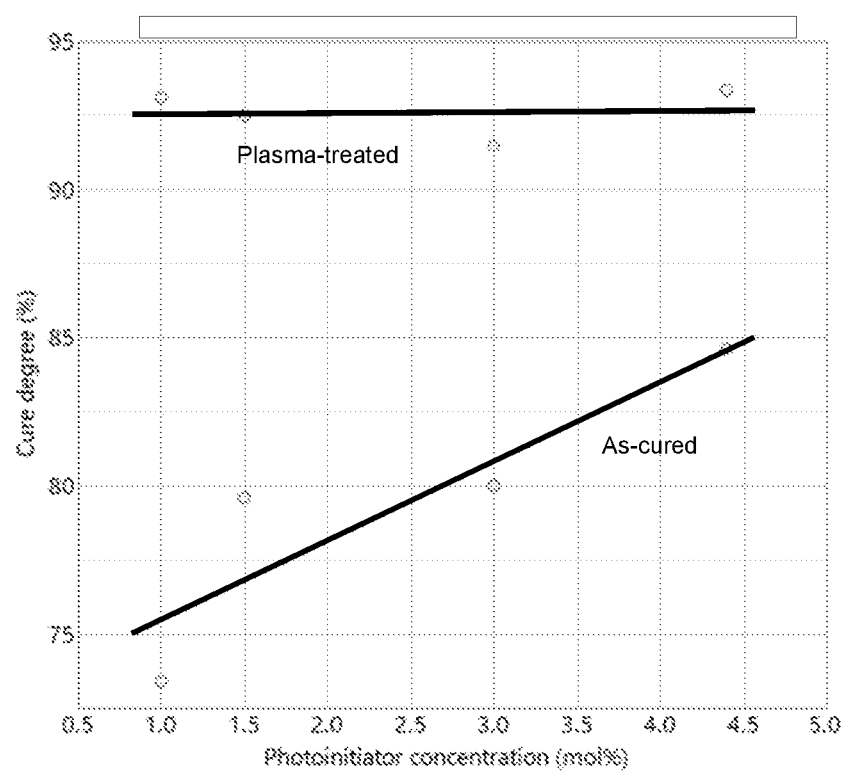
FIG. 7 is a graph of the Cure Degree for an acrylate-based UV-cured film showing the Cure Degree as a function of initial photoinitiator concentration after a single-step UV cure and after a two-step UV cure and plasma treatment.

The graph in FIG. 7 shows the Cure Degree, as measured by FTIR, as a function of the photoinitiator concentration in the ink composition used to form the polymeric films. The data show the outgassing concentration after a UV cure step only, and after a UV cure and a subsequent plasma treatment. The lines in the graph represent linear fits by sample type. The ink composition with the highest TPO concentration was that of Table 2. Ink compositions with lower TPO concentration were formed by reducing the TPO concentration and increasing the concentration of the DDMA by a corresponding amount. As is evident from the graph, the plasma treatment increased the degree of curing for all of the TPO concentrations.

The present teachings are intended to be illustrative, and not restrictive. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a polymeric film over an electronic device, the method comprising:
    forming a cured polymeric film over the electronic device, wherein the cured polymeric film:
    (a) is not fully cured; or
    (b) comprises unreacted cure initiator molecules, fragments of cure initiator molecules, or a combination thereof; or
    (c) both (a) and (b);
    exposing the cured polymeric film to an ultraviolet plasma for a period sufficient to:
    (i) increase the cure degree in the cured polymeric film; or
    (ii) decrease the outgassing of fragments of cure initiator molecules from the cured polymeric film; or
    (iii) both (i) and (ii).

2. The method of claim 1, wherein the electronic device is an organic light-emitting diode.

3. The method of claim 1, wherein the cure initiator molecules, fragments of cure initiator molecules, or a combination thereof are photoinitiator molecules, fragments of photoinitiator molecules, or a combination thereof.

4. The method of claim 3, wherein forming the cured polymeric film comprises curing a composition comprising curable organic monomers by exposing the composition to ultraviolet light from a non-plasma source.

5. The method of claim 1, wherein the polymeric film is an acrylate-based film.

6. The method of claim 1, wherein the cured polymeric film is formed by curing a curable composition comprising:
    a di(meth)acrylate monomer;
    a multifunctional (meth)acrylate monomer; and
    a photoinitiator.

7. The method of claim 6, wherein the curable composition comprises:
    64 mol. % to 98 mol. % di(meth)acrylate monomer;
    1 mol. % to 26 mol. % tri(meth)acrylate monomer, tetra(meth)acrylate monomer, or a combination thereof; and
    1 mol. % to 10 mol. % photoinitiator molecules.

8. The method of claim 1, wherein exposing the cured polymeric film to the ultraviolet plasma occurs without the deposition of material onto the cured polymeric film.

9. The method of claim 1, further comprising depositing an inorganic barrier layer over the cured polymeric film.

10. The method of claim 1, wherein the cured polymeric film has a cure degree of no greater than 85% prior to exposing it to the ultraviolet plasma and a cure degree of at least 90% after exposing it to the ultraviolet plasma.

11. The method of claim 1, wherein the electronic device is maintained at a temperature of at least 80° C. during the exposure to the ultraviolet plasma.

12. The method of claim 1, wherein the polymeric film has a surface roughness of no greater than 10 nm rms.

13. The method of claim 1, wherein the cured polymeric film comprises unreacted diphenyl(2,4,6-trimethylbenzoyl) phosphine oxide, free diphenyl(2,4,6-trimethylbenzoyl) phosphine oxide fragments, or a combination thereof.

14. The method of claim 1, wherein exposing the cured polymeric film to the ultraviolet plasma reduces the outgassing of fragments of cure initiator molecules from the cured polymeric film by a factor of at least 10.

15. The method of claim 14, wherein exposing the cured polymeric film to the ultraviolet plasma increases the cure degree for the cured polymeric film by at least 5%.

* * * * *